(12) United States Patent
Koh et al.

(10) Patent No.: US 9,112,466 B1
(45) Date of Patent: Aug. 18, 2015

(54) METHOD FOR CONTROLLING VOLUME USING A ROTATING KNOB INTERFACE

(75) Inventors: Eugene Koh, San Francisco, CA (US); Joe Freeman Britt, Jr., Los Altos, CA (US)

(73) Assignee: Google Inc., Mountain View, CA (US)

( * ) Notice: Subject to any disclaimer, the term of this patent is extended or adjusted under 35 U.S.C. 154(b) by 535 days.

(21) Appl. No.: 13/493,182

(22) Filed: Jun. 11, 2012

(51) Int. Cl.
*H03G 3/00* (2006.01)
*H03G 3/02* (2006.01)

(52) U.S. Cl.
CPC ........................................ *H03G 3/02* (2013.01)

(58) Field of Classification Search
CPC ........ H03G 3/02; H04R 2499/11; H04R 3/12; H04R 2217/03; H04R 3/002; H04R 3/005
USPC ............... 381/109, 104, 55, 56, 57, 106, 312, 381/315, 334; 84/633, 665; 700/94
See application file for complete search history.

(56) References Cited

U.S. PATENT DOCUMENTS

| | | | |
|---|---|---|---|
| 6,627,829 B2 | 9/2003 | Sato | |
| 7,110,839 B2 | 9/2006 | Wood | |
| 7,390,957 B2 | 6/2008 | Iwata | |
| 2003/0019733 A1 * | 1/2003 | Sato | 200/310 |
| 2003/0220705 A1 | 11/2003 | Ibey | |
| 2006/0196347 A1 * | 9/2006 | Iwata | 84/633 |
| 2010/0310085 A1 * | 12/2010 | Oh et al. | 381/71.11 |

\* cited by examiner

*Primary Examiner* — Vivian Chin
*Assistant Examiner* — Ammar Hamid
(74) *Attorney, Agent, or Firm* — Troutman Sanders LLP; James E. Schutz; Andrew C. Doherty

(57) ABSTRACT

A system and method for controlling the volume output of speakers comprising outputting a varying volume control signal in response to movement of a volume control element. In response to the volume control signal, increasing a volume level of a speaker in a linear correlation with the movement of the volume control element as the volume control element is moved between a first position and a second position. In response to the volume control element moving beyond the second position, increasing the volume level of the speaker to increase asymptotically as the volume control element is moved beyond the second position. Additionally, a visual indicator, such as LED lights, provides an interesting and informative display as the volume level is changed.

20 Claims, 3 Drawing Sheets

METHOD FOR CONTROLLING VOLUME USING A ROTATING KNOB INTERFACE

BACKGROUND

Many audio systems include a rotating volume control knob for controlling the volume output of speakers. However, when using a rotating knob for volume control, a user may accidentally rotate the knob too fast, resulting in an unpleasantly loud volume and potential damage to audio components.

BRIEF SUMMARY

The presently disclosed subject matter presents systems and methods for controlling the volume output of speakers. The present design may provide advantages including that a maximum volume cannot be reached nearly instantaneously, which prevents any attached speaker components from being overdriven, or any unpleasantly loud sound being output from the speakers. Additionally, a visual indicator may provide an interesting and informative display as the volume level is changed.

According to an implementation of the disclosed subject matter, a varying volume control signal may be provided in response to movement, for example rotation, of a volume control element. In particular, the volume control element may be moved between a first position and a second position outputting a volume control signal. In response to the volume control signal, a volume level of a speaker may be increased in a linear correlation with the movement of the volume control element. In response to the volume control element moving beyond the second position, the volume level of the speaker may increase asymptotically towards the maximum volume level output of the speaker, a predefined value, or a user set asymptotic maximum volume level.

In an implementation of the disclosed subject matter, a system may include a movable element for controlling the output of a volume control signal. The system may also include a controller for outputting the volume control signal in correlation with the movement of the movable element. In this regard, the controller may output a volume control signal causing a linear increase in the volume level of a speaker in correlation to the position of the movable element between a first position and a second position. When the movable element is moved beyond the second position, the controller may output a volume control signal causing an asymptotic increase in the volume level of the speaker.

An embodiment of the disclosed subject matter may include a plurality of indicator lights that correspond to movement of the movable element. A first portion of the plurality of indicator lights may be linearly illuminated in a sequence that corresponds to the volume control signal when the movable element is moved between the first and second positions. A second portion of the plurality of indicator lights may be illuminated in an asymptotic sequence that corresponds to the volume control signal when the movable element is moved beyond the second position. Additionally, the illuminated plurality of indicator lights may increase brightness in correlation with the intensity of the volume level of the speaker.

Additional features, advantages, and embodiments of the disclosed subject matter may be set forth or apparent from consideration of the following detailed description, drawings, and claims. Moreover, it is to be understood that both the foregoing summary and the following detailed description are exemplary and are intended to provide further explanation without limiting the scope of the claims.

BRIEF DESCRIPTION OF THE DRAWINGS

The accompanying drawings, which are included to provide a further understanding of the disclosed subject matter, are incorporated in and constitute a part of this specification. The drawings also illustrate embodiments of the disclosed subject matter and together with the detailed description serve to explain the principles of embodiments of the disclosed subject matter. No attempt is made to show structural details in more detail than may be necessary for a fundamental understanding of the disclosed subject matter and various ways in which it may be practiced.

DETAILED DESCRIPTION

A system and method for controlling the volume output of speakers is disclosed. The disclosed embodiments may provide the advantage that a maximum volume cannot be reached nearly instantaneously, which prevents any attached speaker components from being overdriven, or any unpleasantly loud sound being output from the speakers. The volume control element may be, for example, a rotatable knob. Control signals for changing the audio speaker volume may be generated by changing the position of the volume control element from a first position to a second position. The volume control element may be configured to indicate an increase or decrease in audio speaker volume level depending on the direction of rotation. For example, clockwise rotation of the control element may indicate an increase in the output volume of an audio speaker and counterclockwise rotation may indicate a decrease in the output volume of the audio speaker.

In this regard, a user may customize the volume output of a speaker based on their personal preference. For example, a user may choose and set a variety of parameters related to the volume output of a speaker, such as, a minimum volume, a linear maximum volume, an asymptotic maximum volume, and the like. The linear maximum volume may correlate to rotation of a volume control element from a first position to a user-set or predefined second position. The second position may be defined, for example, by an angular displacement relative to the first position. An asymptotic maximum volume may be selected or defined which correlates to rotation of the volume control element beyond the second position. An "asymptotic maximum volume" refers to a maximum volume of a volume output range for a system, that is approached in an asymptotic or similar fashion from a lower volume. In contrast, a "linear maximum volume" is a maximum volume of a volume output range that is reached in a linear or similar fashion from a lower volume. Additionally, indicators, such as LED lights, may provide an interesting and informative display as the volume level is changed.

Figure 1:
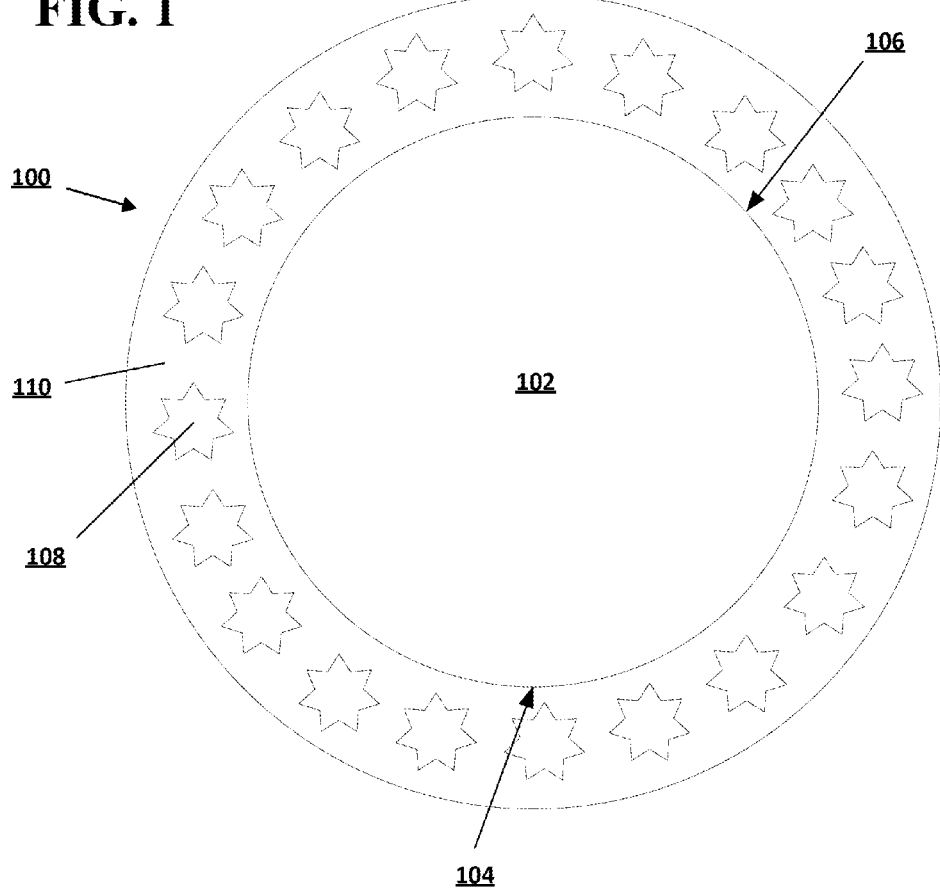
FIG. 1 shows an example of a volume control system according to an embodiment of the disclosed subject matter.

FIG. 1 shows an example of a volume control system 100 according to an embodiment of the disclosed subject matter. The volume control system 100 may control the volume output of an associated speaker by outputting a volume control signal. The volume control system 100 may include a volume control element 102, such as a volume control knob, that rotates in the clockwise and counterclockwise directions without stops, and controls the volume output of a speaker. The volume control element 102 may include an arbitrary first position 104 and an arbitrary second position 106. Arbitrary second position 106 may be defined by an angular displacement relative to the first position 104. Rotation of the volume control element 102 may correlate to a linear output volume range between the first and second positions 104, 106. For example, the linear output volume range may be defined by a minimum volume level, corresponding to the first position 104, and a user set linear or predetermined maximum volume level, corresponding to a user set second position 106. As the user rotates the volume control element 102 from the first position 104 to the second position 106, the volume output level of the speaker rises linearly. The linear volume range associated with the region between the positions 104, 106 may include a range of volume levels which are acceptable for the human ear within a normal operating range of an audio speaker. The user may set the location of the second position 106 by selecting an angular displacement relative to the first position 104. The user may also set the minimum and linear maximum volume levels. Additionally, the first and second positions 104, 106 may be set such that the volume level of the speaker rises linearly from the minimum volume output level of the speaker up to the maximum volume output level of the speaker.

As described above, when the volume control element 102 is rotated between the first position 104 and the second position 106, the volume level of the speaker may increase in a linear or similar correlation to the rotation. The volume level of the speaker may rise up to the user set linear maximum volume level when rotation of the volume control element 102 reaches the second position 106. When the volume control element 102 is rotated beyond the second position 106, the volume level of the speaker may increase asymptotically and may approach, without reaching, an asymptotic maximum volume level. The asymptotic maximum volume level may be set by the user, may be a predefined value, or may be the maximum volume output that the speaker is capable of producing.

The volume level of the speaker may be decreased by rotating the volume control element 102 counterclockwise, for example. Once the element 102 is rotated to decrease the volume level past the first position 104, no further results may be produced and the volume level of the speaker may be maintained at the minimum volume level set by the user or the minimum volume level output of the speaker.

In addition, volume control system 100 may include a visual indicator 110 corresponding to the changes in position of the volume control element and intensity of the volume level. Visual indicator 110 may surround volume control element 102. The visual indicator 110 may include, for example, LED lights 108 (LEDs) or similar lighting devices. The volume level between the minimum volume level and the linear maximum volume level 304 may be indicated by the LEDs 108 between the first position 104 and the second position 106, respectively, being illuminated in order. The LEDs 108 may respond to the rotating volume control element 102 by lighting in a sequence that may follow linearly the increase in volume levels output by the system from the minimum to the linear maximum volume level. As the volume control element 102 is rotated beyond the linear maximum volume level corresponding to second position 106, the LEDs 108 located beyond second position 106 may be illuminated in a sequence that follows asymptotically the increase in the volume level to the asymptotic maximum volume level. For example, a first portion of the visual indicator 110 may include a first plurality of indicator lights 108, and the second portion of the visual indicator 110 may include a second plurality of indicator lights 108. In this regard, a first portion of the visual indicator 110 may be activated in a linear correlation with changes in the position of the control element 102 from the first position 104 to the second position 106. Further, a second portion of the visual indicator 110 may be activated asymptotically in correlation with changes in the position of the control element 102 beyond the second position 106. That is, in the region between the first and second positions 106, 108, for each equal unit of rotation of the volume control element 102, another LED may be illuminated; in the region beyond the second position 108, each LED may require a larger amount of rotation before being illuminated. The visual indicator 110 may be located at other locations other than surrounding the volume control element 102.

Additionally, the intensity of the visual indicator 110 may respond in correlation with changes of the volume level 300. For example, when the speaker volume level 300 is increased, the brightness of the plurality of indicator lights 108 may increase to correspond with rotation of the volume control element 102. In one example, the brightness of the illuminated LEDs 108 may follow linearly the increase in volume levels output by the system from the minimum to the linear maximum volume level. As the volume control element 102 is rotated beyond the linear maximum volume level corresponding to second position 106, the brightness of the illuminated LEDs 108 may increase to the maximum brightness of the LEDs 108 and follow asymptotically the increase in the volume level to the asymptotic maximum volume level.

In one example, the LEDs 108 may respond to rotation of the volume control element 102 by lighting in a sequence and increasing brightness of each illuminated LED, which may follow linearly the increase in volume levels output by the system from the minimum to the linear maximum volume level. As the volume control element 102 is rotated beyond the linear maximum volume level corresponding to second position 106, the LEDs 108 located beyond second position 106 may be illuminated in a sequence and increase in brightness that follows asymptotically the increase in the volume level to the asymptotic maximum volume level. Thus, the brightness of the visual indicator may increase based upon the number of illuminated LEDs, the brightness of each illuminated LED, or both.

Figure 2:
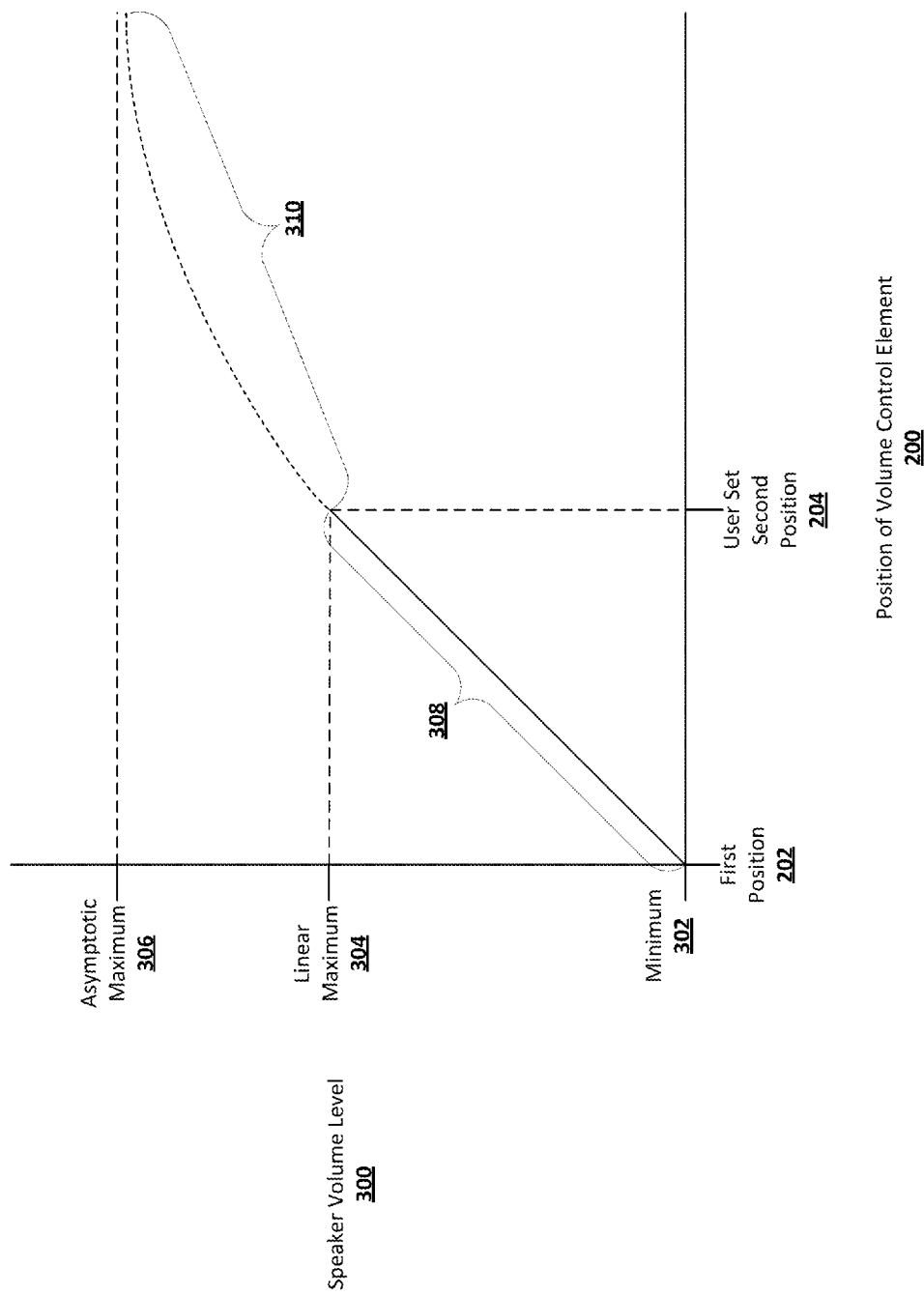
FIG. 2 shows volume level of a speaker in correlation with movement of a volume control element according to an embodiment of the disclosed subject matter.

FIG. 2 shows a correlation between the position of the volume control element 200 and the speaker volume level 300. As can be seen from FIG. 2, when the position of the volume control element 200 is at a first position 202, the speaker volume level 300 may be at a minimum volume level 302. As discussed above, the minimum volume level 302 may be set by a user or may be the minimum volume output level of the speaker or other predefined value. As the position of the volume control element 200 moves/rotates between first position 202 and second position 204, the speaker volume level 300 may change linearly 308 between the minimum volume level 302 and the linear maximum volume level 304. As discussed above, the linear maximum volume level 304 may be set by the user or may be predefined. As the position of the volume control element 200 moves/rotates beyond second position 204, the speaker volume level 300 may change asymptotically 310 between linear maximum volume level 304 and asymptotic maximum volume level 306. As mentioned above, the asymptotic maximum volume level 306 may be set by the user or may be the maximum volume output that the speaker is capable of producing or other predefined value.

In an embodiment of the disclosed subject matter, a varying volume control signal may be output in response to movement, for example rotation, of a volume control element 102, such as a volume control knob. In response to the volume control signal, a volume level of a speaker 300 may be increased in a linear correlation 308 with the movement of the volume control element 102. In particular, the volume control element 102 is moved/rotated between a first position 104 and a second position 106. In response to the volume control element 102 moving beyond the second position 106, the volume level of the speaker increases asymptotically 310 as the volume control element 102 is moved beyond the second position 106.

Additionally, the volume control signal may change as the position of the volume control element 200 changes. The volume control signal may control the output of the speaker volume level 300. The speaker volume level 300 may be set to correspond to a linear maximum level 304 when the volume control element 102 is at the second position 204. The linear maximum level 304 may be set by a user or may be the maximum output volume level of the speaker or other predefined value. The speaker volume level 300 may be set to correspond to an asymptotic maximum level 306 when the control element 102 is moved beyond the second position 204. The asymptotic maximum level 306 may be set by a user or may be predefined.

Furthermore, clockwise rotation of volume control element 102 may indicate an increase in the output volume 300 of an audio speaker and counterclockwise rotation may indicate a decrease in the output volume 300 of the audio speaker.

An embodiment according to the disclosed subject matter may include outputting a volume control signal in response to a change in a position of a volume control element 102. The volume control signal may cause a change in the volume level 300 corresponding to the changes in position of the volume control element 200. The volume control signal may cause a linear rise 308 in the audio speaker volume level 300 as the control element 102 is moved from a first position 202 to a second position 204. Further, the volume control signal may cause an asymptotic rise 310 in the volume level 300 as the control element 102 is moved passed the second position 204.

An embodiment of the disclosed subject matter provides a system which may include a movable element 102 for controlling the output of a volume control signal. A controller for outputting the volume control signal in correlation with the movement of the movable element 102 may also be included. The controller may output a volume control signal causing a linear increase 308 in the volume level of a speaker 300 in correlation to the position of the movable element 200 between the first position 202 and the second position 204.

Although described herein primarily with respect to a volume control knob and a plurality of LEDs, embodiments of the disclosed subject matter may use and may be used with other volume control elements and visual indicators. For example, a slider, up/down buttons, touchscreen, or other volume control element may be used. Generally, any such volume control element may have a first region in which movement of the volume control element results in a volume change that corresponds linearly with the degree of movement of the volume control element, and a second region in which movement of the volume control element results in a volume change that corresponds asymptotically with the degree of movement of the volume control element. Any suitable visual indicator also may be used. For example, a single illuminated element that changes in brightness or amount of the element illuminated, color of illumination or other characteristic, a set of illuminated elements of different sizes, or any other suitable visual indicator may be used. Generally, the visual indicator may have a first region or a first type of behavior that is activated as the volume control element is moved within the first region, and a second region or a second type of behavior that is activated as the volume control element is moved within the second region.

Figure 3:
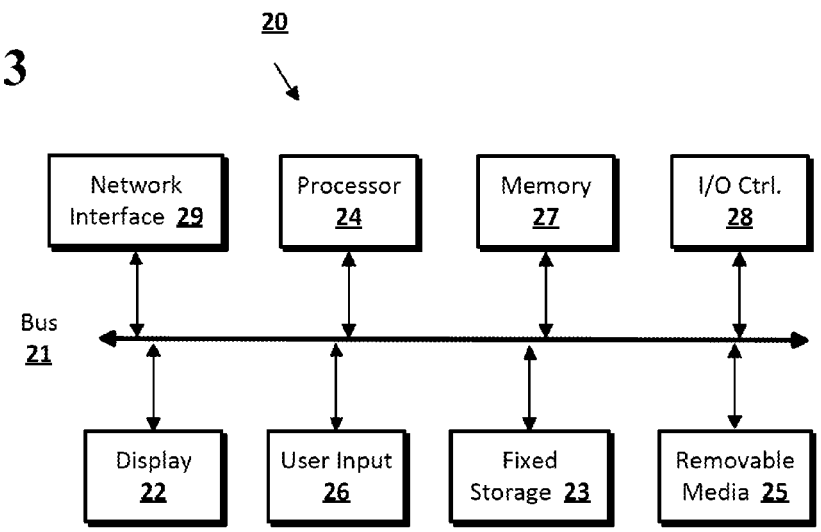
FIG. 3 shows a computer according to an embodiment of the disclosed subject matter.

Embodiments of the presently disclosed subject matter may be implemented in and used with a variety of component and network architectures. FIG. 3 is an example computer 20 suitable for implementing embodiments of the presently disclosed subject matter. The computer 20 includes a bus 21 which interconnects major components of the computer 20, such as a central processor 24, a memory 27 (typically RAM, but which may also include ROM, flash RAM, or the like), an input/output controller 28, a user display 22, such as a display screen via a display adapter, a user input interface 26, which may include one or more controllers and associated user input devices such as a keyboard, mouse, and the like, and may be closely coupled to the I/O controller 28, fixed storage 23, such as a hard drive, flash storage, Fibre Channel network, SAN device, SCSI device, and the like, and a removable media component 25 operative to control and receive an optical disk, flash drive, and the like. A graphical user interface (GUI) may be presented on the user display 22 that a user may interact with via input devices controlled by the user input interface 26. The GUI may present different control screens allowing the user to set a minimum, linear maximum, and asymptotic maximum volume settings for the volume control system. The volume settings may be stored in memory 27 or fixed storage 23.

The bus 21 allows data communication between the central processor 24 and the memory 27, which may include read-only memory (ROM) or flash memory (neither shown), and random access memory (RAM) (not shown), as previously noted. The RAM is generally the main memory into which the operating system and application programs are loaded. The ROM or flash memory can contain, among other code, the Basic Input-Output system (BIOS) which controls basic hardware operation such as the interaction with peripheral components. Applications resident with the computer 20 are generally stored on and accessed via a computer readable medium, such as a hard disk drive (e.g., fixed storage 23), an optical drive, floppy disk, or other storage medium 25.

The fixed storage 23 may be integral with the computer 20 or may be separate and accessed through other interfaces. A network interface 29 may provide a direct connection to a remote server via a telephone link, to the Internet via an internet service provider (ISP), or a direct connection to a remote server via a direct network link to the Internet via a POP (point of presence) or other technique. The network interface 29 may provide such connection using wireless techniques, including digital cellular telephone connection, Cellular Digital Packet Data (CDPD) connection, digital satellite data connection or the like. For example, the network interface 29 may allow the computer to communicate with other computers via one or more local, wide-area, or other networks, as shown in FIG. 4.

Many other devices or components (not shown) may be connected in a similar manner (e.g., document scanners, digital cameras and so on). Conversely, all of the components shown in FIG. 3 need not be present to practice the present disclosure. The components can be interconnected in different ways from that shown. The operation of a computer such as that shown in FIG. 3 is readily known in the art and is not discussed in detail in this application. Code to implement the present disclosure can be stored in computer-readable storage media such as one or more of the memory 27, fixed storage 23, removable media 25, or on a remote storage location.

Figure 4:
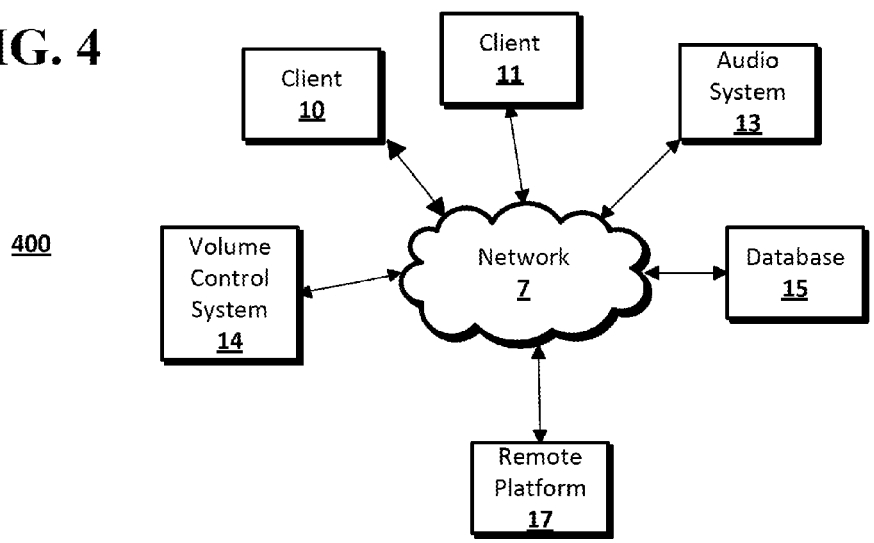
FIG. 4 shows a network configuration according to an embodiment of the disclosed subject matter.

FIG. 4 shows an example network arrangement 400 according to an embodiment of the disclosed subject matter. One or more clients 10, 11, such as local computers, smart phones, tablet computing devices, and the like may connect to other devices via one or more networks 7. The network 7 may be a local network, wide-area network, the Internet, or any other suitable communication network or networks, and may be implemented on any suitable platform including wired and/or wireless networks. The clients may communicate with one or more audio system 13, volume control systems 14 and/or databases 15. The audio system 13 and or the volume control system 14 may be directly accessible by the clients 10, 11, or one or more other devices may provide intermediary access such as where the audio system 13 provides access to resources, e.g., audio data and related content, stored in a database 15. The clients 10, 11 also may access remote platforms 17 or services provided by remote platforms 17 such as cloud computing arrangements and services. The remote platform 17 may include one or more servers 13 and/or databases 15. The audio system 13 may include (not shown) a receiver, a disc player, a hard drive, and the like. The receiver may be capable of playing digital audio files, such as MP3, AAC and the like. The audio system 13 may respond to signals from the volume control system 14. The volume control system 14 may be accessed by the clients 10, 11, and may include operational parameters that may be adjusted or set by the clients 10, 11.

More generally, various embodiments of the presently disclosed subject matter may include or be embodied in the form of computer-implemented processes and apparatuses for practicing those processes. Embodiments also may be embodied in the form of a computer program product having computer program code containing instructions embodied in non-transitory and/or tangible media, such as floppy diskettes, CD-ROMs, hard drives, USB (universal serial bus) drives, or any other machine readable storage medium, wherein, when the computer program code is loaded into and executed by a computer, the computer becomes an apparatus for practicing embodiments of the disclosed subject matter. Embodiments also may be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein when the computer program code is loaded into and executed by a computer, the computer becomes an apparatus for practicing embodiments of the disclosed subject matter. When implemented on a general-purpose microprocessor, the computer program code segments configure the microprocessor to create specific logic circuits. In some configurations, a set of computer-readable instructions stored on a computer-readable storage medium may be implemented by a general-purpose processor, which may transform the general-purpose processor or a device containing the general-purpose processor into a special-purpose device configured to implement or carry out the instructions. Embodiments may be implemented using hardware that may include a processor, such as a general purpose microprocessor and/or an Application Specific Integrated Circuit (ASIC) that embodies all or part of the techniques according to embodiments of the disclosed subject matter in hardware and/or firmware. The processor may be coupled to memory, such as RAM, ROM, flash memory, a hard disk or any other device capable of storing electronic information. The memory may store instructions adapted to be executed by the processor to perform the techniques according to embodiments of the disclosed subject matter.

The foregoing description, for purpose of explanation, has been described with reference to specific embodiments. However, the illustrative discussions above are not intended to be exhaustive or to limit embodiments of the disclosed subject matter to the precise forms disclosed. Many modifications and variations are possible in view of the above teachings. The embodiments were chosen and described in order to explain the principles of embodiments of the disclosed subject matter and their practical applications, to thereby enable others skilled in the art to utilize those embodiments as well as various embodiments with various modifications as may be suited to the particular use contemplated.

What is claimed is:

1. A method, comprising:
responsive to a change in position of a volume control element from a first position to a second position, causing a linear rise in volume level corresponding to the change in position of the volume control element from the first position to the second position;
responsive to a change in position of the volume control element from the second position to a third position, causing an asymptotic rise in the volume level corresponding to the change in position of the volume control element from the second position to the third position; and
activating a visual indicator corresponding to the changes in position of the volume control element, wherein the brightness of the visual indicator increases linearly in correlation with the change in position of the volume control element from the first position to the second position that causes a linear rise in volume level, and the brightness of the visual indicator increases asymptotically in correlation with the change in position of the volume control element from the second position to the third position that causes an asymptotic rise in volume level.

2. A method, comprising:
outputting a varying volume control signal in response to movement of a volume control element;
in response to the volume control element moving from a first position to a second position, linearly increasing a volume level of a speaker; and
in response to the volume control element moving from the second position to a third position, asymptotically increasing the volume level of the speaker.

3. The method of claim 2, wherein the volume control signal changes as the position of the volume control element changes, wherein the volume control signal controls the output volume level of the speaker.

4. The method of claim 2, wherein the volume level of the speaker is set to correspond to a linear maximum level when the control element is at the second position.

5. The method of claim 4, wherein the linear maximum level is set by a user.

6. The method of claim 2, wherein the volume level of the speaker is set to not exceed an asymptotic maximum level when the control element is moved to a third position or beyond.

7. The method of claim 6, wherein the asymptotic maximum level is set by a user.

8. The method of claim 2, wherein the volume control element is a rotatable knob, and the change in position of the volume control element is a clockwise rotation from the first position to the second position.

9. The method of claim 2, further comprising activating a visual indicator corresponding to the changes in position of the volume control element, wherein the brightness of the visual indicator increases linearly in correlation with changes in the position of the control element from the first position to the second position, and the brightness of the visual indicator increases asymptotically in correlation with changes in the position of the control element from the second position to the third position or beyond.

10. The method of claim 2, further comprising activating a visual indicator corresponding to changes in the position of the control element, wherein a first portion of the visual indicator is activated in a linear correlation with changes in the position of the control element from the first position to the second position, and a second portion is activated asymptotically in correlation with changes in the position of the control element from the second position to the third position or beyond.

11. The method of claim 2, wherein clockwise rotation of the volume control element causes an increase in the volume level of the speaker.

12. A system, comprising:
   a movable element for controlling the output of a volume control signal, the movable element being movable from a first position to a second position to a third position;
   a controller for outputting the volume control signal in response to the movement of the movable element, wherein the controller outputs a volume control signal that causes a linear increase in the volume level of a speaker in correlation to the position of the movable element between the first position and the second position, and outputs a volume control signal causing an asymptotic increase in the volume level of the speaker in correlation to the position of the moveable element between the second position and the third position; and
   a plurality of indicator lights that are illuminated in correspondence to the movement of the movable element.

13. The system of claim 12, wherein the speaker volume level is set to correspond to a linear maximum level when the movable element is at the second position.

14. The system of claim 13, wherein the linear maximum level is set by a user.

15. The system of claim 12, wherein the speaker volume level is set to correspond to an asymptotic maximum level when the movable element is moved from the second position to the third position or beyond.

16. The system of claim 15, wherein the asymptotic maximum level is set by a user.

17. The system of claim 12, wherein the movable element is a rotatable knob, and the movable element changes position by a first clockwise rotation from the first position to the second position, and a second clockwise rotation from the second position to the third position.

18. The system of claim 12, wherein a first portion of the plurality of indicator lights are linearly illuminated in a sequence that corresponds to the volume control signal as the movable element is moved between the first and second positions, and a second portion of the plurality of indicator lights are illuminated in an asymptotic sequence that corresponds to the volume control signal as the movable element is moved from the second position to the third position or beyond.

19. The system of claim 12, wherein brightness of the plurality of indicator lights is increased in a linear correlation with changes in the position of the control element from the first position to the second position, and brightness of the indicator lights is increased asymptotically in correlation with changes in the position of the control element from the second position to the third position or beyond.

20. The system of claim 12, wherein clockwise rotation of the volume control element increases the volume level of the speaker.

* * * * *